United States Patent
Parsons et al.

(10) Patent No.: US 6,521,911 B2
(45) Date of Patent: Feb. 18, 2003

(54) HIGH DIELECTRIC CONSTANT METAL SILICATES FORMED BY CONTROLLED METAL-SURFACE REACTIONS

(75) Inventors: Gregory N. Parsons, Raleigh, NC (US); James J. Chambers, Plano, TX (US); M. Jason Kelly, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 09/908,766

(22) Filed: Jul. 19, 2001

(65) Prior Publication Data

US 2002/0043666 A1 Apr. 18, 2002

Related U.S. Application Data

(60) Provisional application No. 60/220,463, filed on Jul. 20, 2000.

(51) Int. Cl.[7] .................. H01L 29/04; H01L 31/036; H01L 31/0376; H01L 31/20
(52) U.S. Cl. ........................... 257/52; 438/482
(58) Field of Search ................ 438/481, 591, 438/482, 216; 257/347, 349, 52, 410, 200

(56) References Cited

U.S. PATENT DOCUMENTS

| | | | | |
|---|---|---|---|---|
| 4,593,454 A | | 6/1986 | Baudrant et al. | 29/571 |
| 4,714,951 A | | 12/1987 | Baudrant et al. | 357/67 |
| 4,980,307 A | * | 12/1990 | Ito et al. | 437/40 |
| 6,248,459 B1 | * | 6/2001 | Wang et al. | 428/700 |
| 6,270,568 B1 | * | 8/2001 | Droopad et al. | 117/4 |
| 6,291,319 B1 | * | 9/2001 | Yu et al. | 438/481 |
| 6,319,730 B1 | * | 11/2001 | Ramdani et al. | 438/3 |

FOREIGN PATENT DOCUMENTS

| | | |
|---|---|---|
| EP | 0 077 200 | 4/1983 |
| EP | 0 143 700 | 6/1985 |

OTHER PUBLICATIONS

Gurvitch et al., "Study of Thermally oxidized yttrium films on silicon", *Appl. Phys. Lett.*, 51:12 919–921 (1987) New York, New York Month unknown.

Kalkur et al., "Yttrium Oxide Based Metal–Insulator–Semiconductor Structures on Silicon", *Thin Solid Films*, 170 (1989), 185–190, Lausanne, CH Month unknown.

Chambers et al., "Yttrium silicate formation on silicon: Effect of silicon preoxidation and nitridation on interface reaction kinetics," Applied Physics Letters, vol. 77, No. 15, Oct. 9, 2000, pp. 2385–2387.

International Search Report for PCT/US01/22711 dated Apr. 17, 2002.

Lee et al., "The Kinetics of the Oxide Charge Trapping and Breakdown in Ultrathin Silicon Dioxide", *J. Applied Physics* 73:9 (1993) Month unknown.

Lee et al., "Interfacial Reactions of Ultrahigh Vacuum Deposited Yttrium Thin Films on (111)Si at Low Temperatures", *J. Appl. Physics* 73:12 (1993) Month unknown.

(List continued on next page.)

*Primary Examiner*—David Nelms
*Assistant Examiner*—Tu-Tu Ho
(74) *Attorney, Agent, or Firm*—Myers Bigel Sibley & Sajovec

(57) ABSTRACT

A method of forming an insulation layer on a semiconductor substrate includes modifying a surface of a semiconductor substrate with a metal or a metal-containing compound and oxygen to form an insulation layer on the surface of the semiconductor substrate, wherein the insulation layer comprises the metal or metal-containing compound, oxygen, and silicon such that the dielectric constant of the insulation layer is greater relative to an insulation layer formed of silicon dioxide, and wherein the insulation layer comprises metal-oxygen-silicon bonds.

40 Claims, 6 Drawing Sheets

OTHER PUBLICATIONS

Mazurek et al., "Direct Observation of Rare–Earth Silicide Epilayer Formation by RHEED Technique", 46:5/6 531–535 (1995) Month unknown.

Mesarwi et al., "X–Ray Photoemission Study of Y–Promoted Oxidation of the Si(100) Surface", *Surface Science* 244 15–21 (1991).

Murarka, S.P., "Refractory Silicides for Integrated Circuits", *J. Vac. Sci. Technology* 17:4 (1980).

Murarka et al., Oxidation of Tantalum Disilicide on Polycrystalline Silicon, *J. Applied Physics*, 51:6, 3241–3244 (1980) Month unknown.

Murarka et al., "Thermal Oxidation of Hafnium Silicide Films on Silicon", *Appl. Phys. Lett.* 37:7 639–641 (1980).

Mochizuki et al., "Characterization of Thin Film Molybdenum Silicide Oxide", *J. Electrochem. Soc.* 127:5 1128–1135 (1980).

Nigara et al., "Infrared Properties of Yttrium Oxide", *Journal of the Physical Society of Japan* 30:2 453–458 (1971) Month unknown.

Pellissier et al., "Mechanism of the Y/Si Interface Formation Studied by Photoemission", *Surface Science*, 210 99–113 (1989) Month unknown.

Shappir et al., "Investigation of MOS Capacitors with Thin $ZrO_2$ Layers and Various Gate Materials for Advanced DRAM Applications", *IEEE Transactions on Electron Devices* 33:4 (1996) Month unknown.

Webster et al., "Oxidation Protection Coatings for C/SiC Based on Yttrium Silicate", Elsevier Science Limited 2345–2350 (1998) Month unknown.

Wilk et al., "Hafnium and Zirconium Silicates for Advanced Gate Dielectrics", *Journal of Applied Physics*, 87:1 484–492 (Jan. 2000).

Zrinsky et al., "Oxidation Mechanisms in $WSi_2$ Thin Films", *Appl. Phys. Lett.* 33:1 76–78 (1978).

Alekseev et al., "Structure and Properties of Vacuum Condensates of Yttrium Oxide", Plenum Publishing Corporation 1748–1751 (1987).

Baglin et al., "Diffusion Marker Experiments with Rare–Earth Silicides and Germanides: Relative Mobilities of the Two Atom Species", *J. Appl. Phys.* 52:4 2841–2845 (1981).

Balog et al., "Thin Films of Metal Oxides on Silicon by Chemical Vapor Deposition with Organometallic Compounds", *Journal of Crystal Growth* 17 298–301 (1972).

Baptist et al., "Chemical Bonding in Layered Y $Si_{=1-7}$", *Solid State Communications* 68:6 555–559 (1988).

Buchanan et al., "Reliability and Integration of Ultra–thin-Gate Dielectrics for Advanced CMOS", *Microelectronic Engineering* 36 13–20 (1997).

Campbell et al., "Titanium Dioxide ($TiO_2$)–Based Gate Insulators", *IBM J. Research Development*, 43:3 383–391 (1999).

Gurvitch et al., "Study of Thermally oxidized yttrium films in silicon", *Appl. Phys. Lett.*, 51:12 919–921 (1987).

Gusev et al., "Growth Mechanism of Thin Silicon Oxide Films on Si(100) Studied by Medium–Energy Ion Scattering", *Physical Review B*, 52:3 1759–1775 (1995).

B. He et al., "A 1.1 nm Oxide Equivalent Gate Insulator Formed Using $TiO_2$ on Nitrided Silicon", *International Electron Devices Meeting Technical Digest*.21.8.1–21.8.3. (1998).

Hubbard et al., "Thermodynamic Stability of Binary Oxides in Contact with Silicon", *J. Mater. Res.* 11:11 2757–2776 (1996).

Lee et al., "Epitaxial Growth of Yttrium Silicide $YSi_{2-x}$ on (100) Si", *Journal of Alloys and Compounds*, 193 289–291 (1993).

Chambers et al., "Physical and Electrical Characterization of Ultrathin Yttrium Silicate Insulators on Silicon", *Journal of Applied Physics*, vol. 90, 2, Jul. 15, 2001.

Son et al., Ultrathin $Ta_2O_5$ Film Growth by Chemical Vapor Deposition of $Ta(N(CH_3)_2)_5$ and $O_2$ on Bare and $SiO_xN_y$-Passivated Si(100) for Gate Dielectric Applications, *Journal of Vacuum Science & Technology A*, vol. 16, 3, pp 1670–1675 May/Jun. 1998.

Lee et al., "Thermal Stability and Electrical Characteristics of Ultrathin Hafnium Oxide Gate Dielectric Reoxidized with Rapid Thermal Annealing", *Applied Physics Letters*, vol. 76, 14,pp. 1926–1928, Apr. 3, 2000.

Alers et al., "Intermixing at the Tantulum Oxide/Silicon Interface in Gate Dielectric Structures", *Applied Physics Letters*, vol. 73, 11,pp. 1517–1519, Sep. 14, 1998.

Kang et al., "Interfacial Reactions in the Thin Film $Y_2O_3$ on Chemical Oxidized Si(100) Substrate Systems", *Thin Solids Films*, 353, pp. 8–11, 1999. (Month unknown).

Klein et al., "Evidence of Aluminum Silicate Formation During Chemical Vapor Deposition of Amorphous $Al_2O_3$ Thin Films on Si(100)", *Applied Physics Letters*, vol. 75, 25,pp. 4001–4003, Dec. 20, 1999.

* cited by examiner

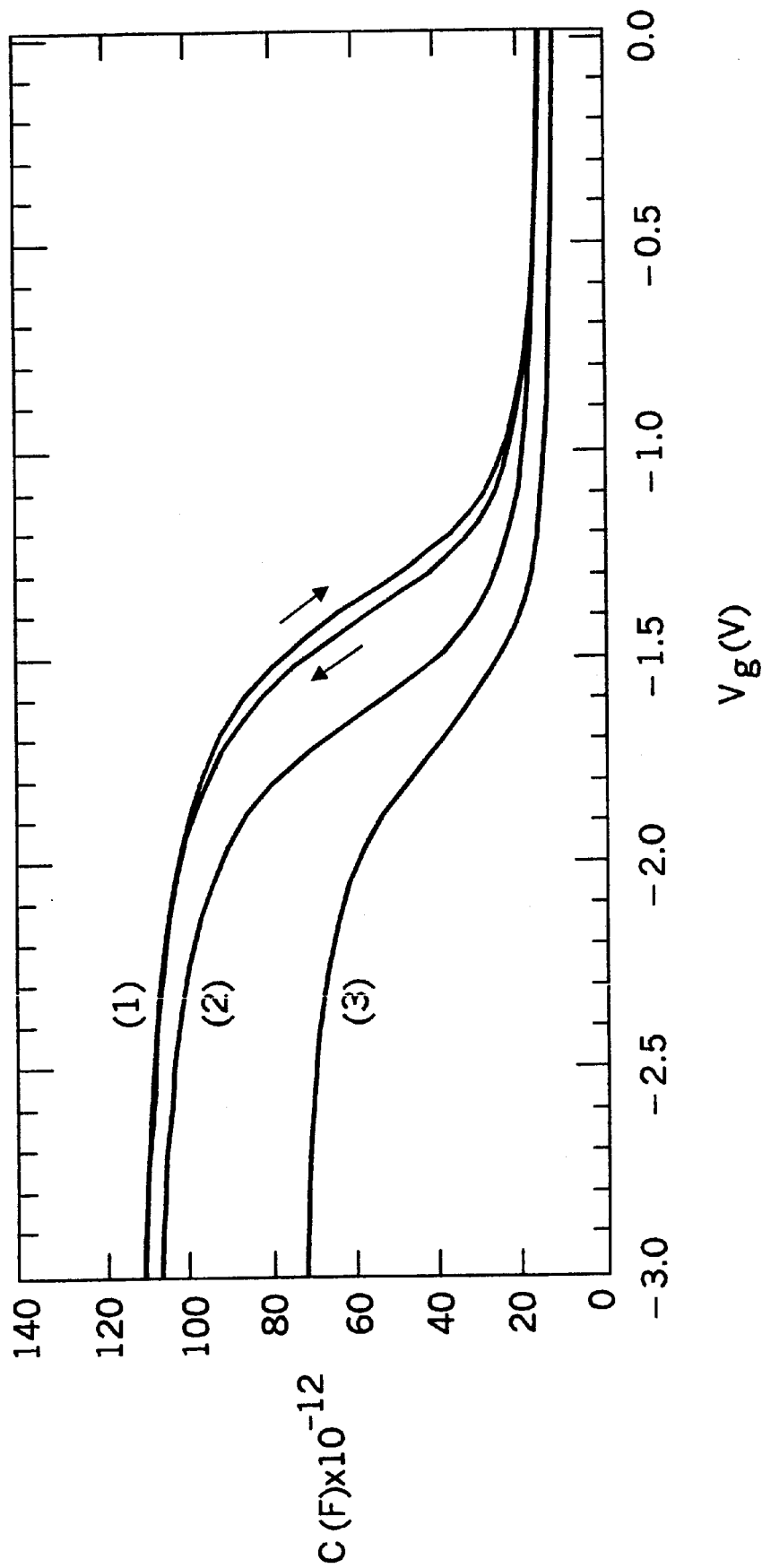

HIGH DIELECTRIC CONSTANT METAL SILICATES FORMED BY CONTROLLED METAL-SURFACE REACTIONS

CROSS REFERENCE TO RELATED APPLICATIONS

The present application claims priority to Provisional Application No. 60/220,463 filed Jul. 20, 2000, the disclosure of which is incorporated herein by reference in its entirety.

FIELD OF THE INVENTION

The invention generally relates to insulation layers on semiconductor substrates, along with methods of forming the same, and microelectronic devices that include the insulation layers.

BACKGROUND OF THE INVENTION

There is an increasing interest in forming advanced complementary metal-oxide semiconductor (CMOS) devices. In is generally believed that such devices may require high dielectric constant (high-k) gate insulators to maintain sufficient capacitance while minimizing tunneling. Physical vapor deposition (PVD) and chemical vapor deposition (CVD) of high-k materials often results in lower-k interface layers that are believed to result from unwanted reactions with the silicon substrate. See e.g., K. A. Son et al., *J. Vac. Sci. Technol.* A 16, 1670–1675 (1998), B. H Lee et al., *Appl. Phys. Lett.* 76, 1926 (2000), G. B. Alers et al., *Appl. Phys. Lett.* 73, 1517–1519 (1998), S. K. Kang et al., *Thin Sol. Films* 353, 8–11 (1999), and T. M. Klein et al., *Appl. Phys. Lett.* 75, 4001–4003 (1999). These reactions are believed to result from the non-equilibrium nature of the deposition. High-k CVD from metal-organic sources on clean silicon (Si) typically involves the breaking of a metal-ligand bond, chemisorption of the metal complex, forming, for example, metal-silicon, silicon-carbon, silicon-hydroxide bonds, and the like, and subsequent oxidation.

Notwithstanding these previous efforts, there remains a need in the art for metal silicate insulators that have high dielectric constants which may be employed in advanced electronic devices without markedly increasing current leakage or tunneling through a corresponding gate stack.

SUMMARY OF THE INVENTION

In one aspect, the invention provides a method of forming an insulation layer on a semiconductor substrate. The method comprises modifying a surface of a semiconductor substrate with a metal or a metal-containing compound and oxygen to form an insulation layer on the surface of the semiconductor substrate, wherein the insulation layer comprises the metal or metal-containing compound, oxygen, and silicon such that the dielectric constant of the insulation layer is greater relative to an insulation layer formed of silicon dioxide, and wherein the insulation layer comprises metal-oxygen-silicon bonds.

In another aspect, the invention provides a surface-modified semiconductor substrate comprising a semiconductor substrate comprising silicon; and an insulation layer formed on a surface of the semiconductor substrate. The insulation layer comprises a metal or metal-containing compound, oxygen, and silicon such that the dielectric constant of the insulation layer is greater relative to an insulation layer formed of silicon dioxide, and the insulation layer also comprises metal-oxygen-silicon bonds.

In another aspect, the invention provides a microelectronic device comprising the surface-modified semiconductor substrate described above.

These and other aspects and advantages of the present invention are set forth in greater detail herein.

BRIEF DESCRIPTION OF THE DRAWINGS

FIG. 2 illustrates capacitance vs. voltage (C-V) curves for various films fabrication in accordance with the invention.

DETAILED DESCRIPTION OF THE PREFERRED EMBODIMENTS

Figure 1:
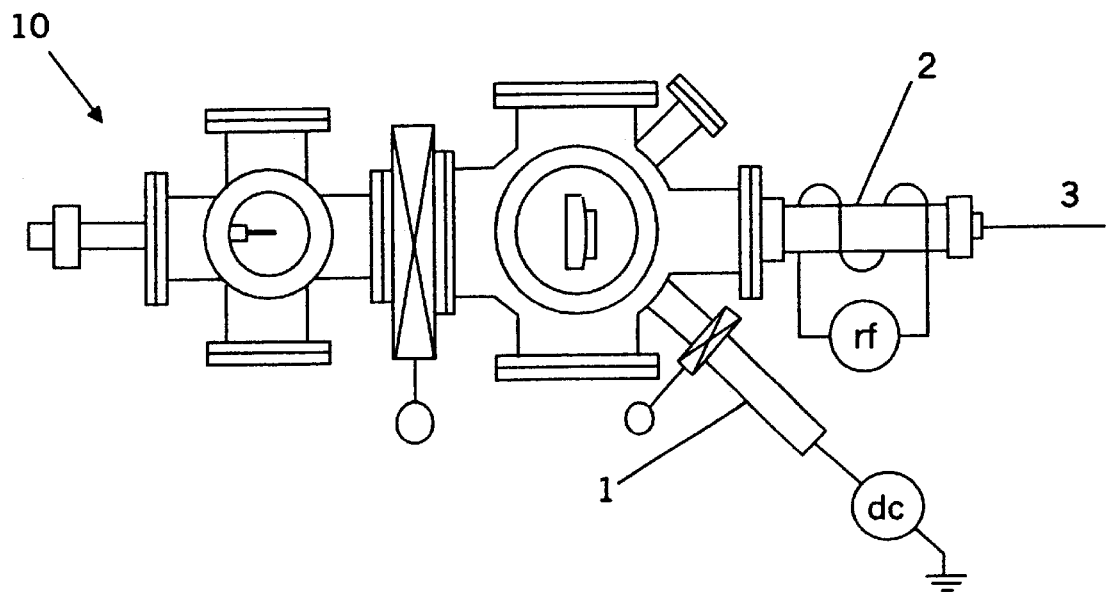
FIG. 1 illustrates an embodiment of a system used to sputter metal and perform anneals according to the invention.

The invention will now be described in detail with reference to the following embodiments set forth herein, including, without limitation, those embodiments described in the drawings. It should be appreciated that these embodiments merely serve to illustrate the invention and do not limit the scope of the invention.

In one aspect, the invention provides a method of forming an insulation layer on a semiconductor substrate. The method comprises modifying a surface of a semiconductor substrate with a metal or a metal-containing compound and oxygen to form an insulation layer on the surface of the semiconductor substrate. The insulation layer comprises the metal or metal-containing compound, oxygen, and silicon such that the dielectric constant of the insulation layer is greater relative to an insulation layer formed of silicon dioxide having, for example, a similar thickness. Metal-oxygen-silicon bonds are present in the insulation layer.

The silicon semiconductor substrate utilized in accordance with the invention may include various materials such as, without limitation, silicon, silicon carbide, gallium arsenide, gallium nitride, and combinations thereof. The selection of such substrates is known to one skilled in the art.

Any number of metals can be used for the purposes of the invention. Examples of such metals include, without limitation, yttrium, lanthanum, scandium, zirconium, halfnium, cesium, aluminum, and combinations thereof. Metal-containing compounds can include, as an example, alloys and oxides of the metals set forth herein. Alloys include without limitation, aluminates of any of the above metals. Metal oxides of any of the above metals may also be utilized. Exemplary metal oxides include, without limitation, $Y_2O_3$, $Ta_2O_5$, $HfO_2$, and $ZrO_2$, $La_2O_3$, as well as combinations thereof.

The insulation layers of the invention may be made so as to have various thicknesses. In one embodiment, the insulation layer preferably has a thickness ranging from about 5 Å to about 100 Å.

Advantageously, the insulating layers of the invention have improved dielectric constants relative to layers formed from silicon dioxide. In one preferred embodiment, the insulation layer has a dielectric constant which is at least a factor of 3 greater relative to an insulation layer that does not include the metal or metal-containing compound, i.e., an $SiO_2$ insulation layer. More preferably, the insulation layer has a dielectric constant which is a factor ranging from about 3, 4, or 5 to about 7, 8, 9, or 10 greater than an $SiO_2$ insulation layer without the metal or metal-containing compound having a thickness similar to the insulation layer of the invention. Moreover, in a preferred embodiment the insulation layer of the invention has reduced defects relative to an $SiO_2$ insulation layer. In a preferred embodiment, the insulation layer as a defect density no greater than $10^{12}$ defects/cm$^2$. In a more preferred embodiment, the insulation layer as a defect density no greater than $10^{11}$ defects/cm$^2$. It is believed by judicious selection of amounts of various components, one is able to achieve the benefits of invention with respect to the insulation layer. In one preferred embodiment, the insulation layer comprises of from about 2, 10, or 20 to about 25, 30, or 40 atomic percent of the metal, from about 40, 45, or 50 to about 55, 60, or 66 atomic percent of oxygen, and about or above 0, 5, 10, or 15 to about 20, 25, 30, or 33 atomic percent of silicon. Additionally, in a preferred embodiment, the insulation layer has reduced leakage current relative to a layer of similar thickness of $SiO_2$. As an example, the leakage current may be reduced by a factor preferably by at least a factor of 2, and more preferably by a factor ranging from about 2, 10, 100, or 500 to about 600, 800, or 1000.

The method of the invention may be carried out in a number of embodiments, using equipment that is known in the art. In one embodiment, the modifying step of the invention includes forming an insulating layer on the semiconductor substrate; and subjecting the semiconductor substrate and insulating layer to conditions sufficient such that the metal or metal-containing compound react with the insulating layer to modify the insulating layer to increase the dielectric constant. Preferably, the step of subjecting the semiconductor substrate to conditions sufficient such that the metal or metal-containing compound forms the insulation layer includes subjecting the semiconductor substrate to a process selected from the group consisting of an annealing in a vacuum, annealing in an oxidizing ambient, and annealing in a combined vacuum/oxidation ambient such that the insulation layer is formed. In another embodiment, the modifying step includes depositing the at least one metal or metal-containing compound by chemical vapor deposition or reactive atomic layer chemical vapor deposition.

In one preferred embodiment, the modifying step of the invention includes oxidizing a surface of the semiconductor substrate to form a silicon dioxide layer thereon; then depositing at least one metal or metal-containing compound on the surface of the semiconductor substrate to form a layer thereon; and then annealing the semiconductor substrate to modify the surface of the semiconductor substrate. Preferably, prior to the oxidation step, the surface of the semiconductor substrate may be cleaned by using accepted techniques.

The oxidizing step may be carried out using various techniques known to one skilled in the art. Preferably, the oxidation is a plasma oxidation. Exemplary sources of oxygen include, but are not limited to, oxygen atoms, oxygen ions, oxygen metastables, oxygen molecular ions, oxygen molecular metastables, compound oxygen molecular ions, compound oxygen metastables, compound oxygen radicals, and mixtures thereof. Compounds that can be employed in as sources include, but are not limited to, $O_2$, $N_2O$, and mixtures thereof. The oxidation may be carried out under a number of conditions. Preferred conditions for the oxidation is at a temperature ranging from about 25° C. to about 900° C. and a pressure ranging from about $10^{-3}$ Torr to about 760 Torr. In general, it is preferred that the processing conditions lead to an oxidation thickness ranging from about 2 to 15 Å.

The deposition of the metal or metal-containing compound may be carried out according to a number of techniques. In a preferred embodiment, the metal or metal-containing compound is deposited on the surface of the semiconductor substrate by employing a Chemical Vapor Deposition process or a plasma Chemical Vapor Deposition process. Specific examples of processes include, without limitation, a laser-assisted chemical vapor deposition, a direct or remote plasma assisted chemical vapor deposition, or an electron cyclotron resonance chemical vapor deposition. Examples of these processes are described in Ser. No. 09/434,607, filed Nov. 5, 1999, the disclosure of which is incorporated herein by reference in its entirety. Preferably, the metal or metal-containing deposition step is carried out at a temperature ranging from about 25° C. to about 900° C. and a pressure ranging from about $10^{-3}$ Torr to about 760 Torr. In general, it is preferred that the processing conditions lead to an oxidation thickness ranging from about 2 to 15 Å.

The annealing step used in the above-mentioned embodiment may be carried out using equipment known to the skilled artisan. It is preferred that the annealing step take place by exposing the semiconductor substrate to an inert ambient (e.g., $N_2$, Ar, H, and/or moderate vacuum), preferably a nitrogen-containing atmosphere. Preferably, the annealing takes place at a temperature of from about 600° C. to about 1100° C., a pressure ranging from about $10^{-6}$ Torr to about 760 Torr, and a time ranging from about 1 sec. to about 10 min.

In another embodiment, the oxidation step may be replaced by the step of exposing the semiconductor substrate to nitrogen-containing atmosphere (e.g., $N_2$) utilizing plasma so as to form a nitrogen-containing film thereon, preferably in the form of a monolayer. Preferred conditions for this step occur at a temperature ranging from about 25° C. to about 900° C. and a pressure ranging from about $10^{-3}$ Torr to about 760 Torr. Preferably, a monolayer film of $N_2$ is formed on the substrate. Thereafter, a metal containing compound (in this embodiment, metal oxide) is deposited to form a layer on the nitrogen-containing film, and the substrate is annealed as described above. Silicon from the semiconductor substrate is believed to diffuse through the nitrogen layer and react with the metal and oxygen in the layer thereon to form metal-oxygen-silicon bonds in the insulation layer.

In another aspect, the invention provides a surface-modified semiconductor substrate. The surface-modified semiconductor substrate comprises a semiconductor substrate comprising silicon and an insulation layer formed on a surface of the semiconductor substrate. The insulation layer comprises a metal or metal-containing compound, oxygen, and silicon such that the dielectric constant of the insulation layer is greater relative to an insulation layer formed of silicon dioxide without the metal or metal-containing compound. The insulation layer comprises metal-oxygen-silicon bonds. The semiconductor substrate and the insulation layer described in this aspect may encompass, without limitation, all embodiments set forth herein. In another aspect, the invention encompasses a microelectronic device comprising the surface-modified semiconductor substrate. Exemplary microelectronic devices which include the surface-modified semiconductor substrate include, without limitation, thin film transistors, complementary metal oxide semiconductor (CMOS) gate dielectric devices, memory devices, back-end integrated circuit (IC) applications, molecular electronic devices, and organic electronic devices In another embodiment, the microelectronic device may include elements electronically or physically coupled with semiconducting substrates. In general, the surface-modified semiconductor substrates can be used in microelectronic applications in which it is desirable to employ a substrate that has an interface with a higher dielectric constant relative to silicon dioxide.

EXAMPLES

The invention will now be described in detail with respect to the following examples. It should be appreciated that these examples are for illustrative purposes only, and are not meant to limit the scope of the invention as defined by the claims.

In these examples, metal films (e.g., yttrium) were generally sputtered in a two-chamber vacuum system equipped with a load-lock and a plasma processing chamber 10 as illustrated in FIG. 1 which includes sputter target 1, plasma tube 2, and gas inlet 3 (e.g., Ar, $N_2O$, and $N_2$). A base pressure of $1 \times 10^{-7}$ Torr was attained in the load-lock using a hybrid-turbo and dry diaphragm pumping system. Silicon samples were transferred from the load-lock to a manipulator with full X, Y, Z, and $\theta$ motion in the processing chamber. A base pressure of $5 \times 10^{-7}$ Torr in the processing chamber was achieved with a hybrid-turbo and dry scroll pump combination, which doubles as the process gas pumping system. The process pressure can be controlled from 1 to 100 mTorr via a closed loop system containing a motorized 20 cm butterfly valve located directly above the hybrid-turbo and a capacitance manometer located near the sample in the processing chamber. The processing chamber is outfitted with a cylindrical plasma source that can be configured to run in a remote plasma mode to perform in situ silicon surface preparations and in a direct plasma mode to sputter yttrium (or other metals or metal-containing compounds) thin films.

The cylindrical plasma source consisted of a 500 W, 13.56 MHz radio frequency (rf) power supply and an autotuned matching network, a quartz plasma tube 5×15.25 cm (diameter×length), and an air-cooled excitation coil (grounded at one end) of 0.95 cm nominal diameter copper tubing with two turns of 12.7 cm diameter spanning 5 cm enclosed in a stainless steel electrostatic shield. The Ar, $N_2$, and $N_2O$ process gas flows were supplied to the chamber through the front of the plasma tube and regulated from 1 to 100 sccm ($N_2$) with mass flow controllers. The processing chamber was equipped with a retractable metal or metal-containing compound sputter target that can be isolated from the system by a gate valve. A 200 W dc power supply that provided up to −1000 V of bias to the sputter target and a 600 W radiant heater that enabled substrate temperatures of up to 650° C. were employed. Post-deposition vacuum anneals were performed in situ. The plasma processing chamber was also compatible with in situ plasma oxidation. In these examples, oxidation was performed ex situ from the processing chamber in a standard 10 cm diameter tube furnace at temperatures ranging from 500° C. to 900° C. in 1 atm $N_2O$ or air.

Substrates were n-(1.0 to 2.0 $\Omega$ cm) or p-type (0.1 to 0.3 $\Omega$ cm) Si(100) cut from commercial wafers into 2.5×2.5 cm samples. Samples were prepared by dipping for 5 min. in a tetramethylammonium hydroxide based alkaline solution with a caboxylate buffer, rinsing in deionized (DI) water, etching in buffered hydrogen fluoride (HF) for 30 seconds with no final rinse, and loading immediately into vacuum.

Sputtering in these examples was performed at room temperature in 4.3 mTorr Ar and an rf power of 420 W. During sputtering, the metal target was fully extended into the plasma and biased at approximately 1000 V dc. In the case of yttrium, such metal is reactive, and residual oxygen or water in the system may affect the target surface and sputter rate. To potentially control this situation, the target was conditioned before loading samples and performing runs by sputtering for 30 to 60 minutes at standard conditions. The target current typically was observed to decrease from approximately 10 to 5 mA during this time, and the target was considered clean when the current stabilized at approximately 5 mA. For various embodiments, the samples were rotated into the line-of-sight of the target at a distance of approximately 1.25 cm from the sputtering target.

To calibrate the metal (e.g., yttrium) sputter rate, a series of metal (e.g., yttrium) films with thicknesses of from 200 Å to 1000 Å were blanket deposited onto 1000 Å of wet oxidized $SiO_2$. After deposition, one-half of each sample was masked with photoresist and soft baked for 2 min at 70° C. The masked samples were then etched in Al etch (phosphoric/nitric/acetic acid mixture), rinsed in DI water and dried with $N_2$. After etching, the photoresist was stripped in acetone, although other solvents may be used. The samples were then rinsed in DI water and dried with $N_2$. Film thicknesses were determined by taking five step height measurements across the sample with an Alpha-Step 500 and taking the average value. Uniformity across the sample was estimated to be approximately 85 percent. The average thickness was plotted versus sputter time, and the sputter rate was taken as the slope of the least-squares fit. The fits with the y intercept set at zero were excellent ($R^2$ approximately equal to 0.998). The sputter deposition rate was approximately 40 Å/min. Metal (e.g., yttrium) film thicknesses for each run were determined by monitoring the sputter time while maintaining a constant sputter rate. The conditions for plasma ignation and stabilization were achieved using an autotuned matching network. Typical thin metal (approximately 8 Å) films required a sputter time of 12 s. Plasma initiation was rapid (less than 1 sec) and, therefore, not expected to affect the initial sputter rate.

Silicide films in these examples were prepared by sputtering metal (e.g., yttrium) onto HF-last silicon at room temperature and in situ annealing in vacuum (maximum pressure was approximately $5 \times 10^{-6}$ Torr). The temperature ramp for the annealing step was performed at approximately 0.5° C./s up to a temperature of 600° C. where the sample was held for 20 min.

During the annealing step, the metal (e.g., yttrium) sputter target was isolated from the system. After annealing, the silicide films were allowed to cool in vacuum for 5 min. and in 1 atm $N_2$ for an additional 5 min. The metal/silicon system is believed to form the following phases in an embodiment employing yttrium: $YSi_{0.6}$, $YSi_{0.8}$, YSi, and $YSi_{1.67}$ being the phases with $YSi_{1.67}$ being the phase formed when yttrium is annealed on silicon as reported. See e.g., Y. K. Lee, et al., *J. Alloys Compd.* 193, 289 (1993) and *Binary Alloy Phase Diagrams*, Vol. 2, edited by T. B. Massaiski (American Society for Metals, Metals Park, Ohio 1986).

Oxidation was performed ex situ in the furnace described herein at temperatures ranging from 500° C. and 900° C. at times ranging from 6 sec. to 20 min. Samples were placed onto a quartz boat and quickly (approximately 1 sec.) pushed by hand to the center of the furnace, and the oxidation time was the time the sample spent at the center of the furnace. $N_2O$ and air were employed as oxidizers. When $N_2O$ was used as the oxidizer, the flow rate was 5 slm ($N_2$).

X-ray photoelectron spectroscopy, medium energy ion scattering, electrical measurements, Fourier transform infrared spectroscopy, atomic force microscopy, and transmission electron microscopy for evaluating various film and sample properties were carried out for as described in J. J. Chambers et al. *Journal of Applied Physics*, 90 (2) pp. 918–933 (2001).

Example 1

Surface Modification of Semiconductor Substrate

A silicon semiconductor substrate is exposed to a plasma $N_2$ atmosphere such that a thin layer of $N_2$ is formed thereon. Thereafter, a metal oxide is deposited on the substrate surface using a CVD or plasma CVD process at 400° C. The layer is then annealed at 900° C. in a nitrogen ($N_2$) atmosphere for 10 minutes. Silicon diffuses through the nitrogen layer and reacts with the metal oxide such that metal-oxygen-silicon bonds are formed therein.

The C-V curve is set forth in FIG. 2. As seen, the curve corresponding to this example (labeled (2)) exhibits an EOT of 25 Å that is comparable to an EOT of 24.4 Å for bare Si, corresponding to the curve labeled (1).

Example 2

Surface Modification of Semiconductor Substrate

The procedure according to Example 1 is repeated except that the substrate is first subjected to a plasma oxidation instead of nitrogen. Metal is then deposited thereon by a CVD or plasma CVD process, and the substrate is annealed.

The C-V curve is set forth in FIG. 2. As seen, the curve corresponding to this example (labeled (3)) exhibits an EOT of 37.7 Å that is favorable to the curve labeled (1).

Example 3

Capacitance-Voltage (C-V) Curve for a Y—O—Si Film

Y—O—Si films (approximately 40 Å thick) were formed by oxidizing approximately 8 Å of yttrium on silicon. The oxidation was carried out at 900° C. for 15 seconds in 1 atm of $N_2O$.

Figure 3:
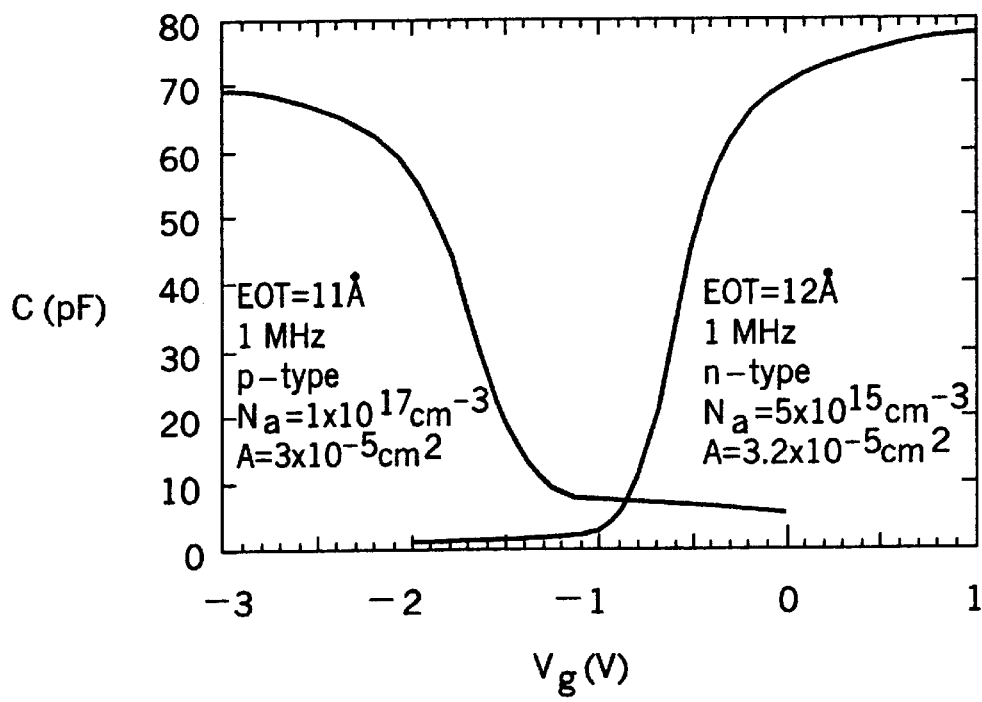
FIG. 3 illustrates an MHz C-V curve for an Al/Y—O—Si/n- and p-type capacitors.

Analysis of the C-V curve for the film formed on n-type Si substrate is presented in FIG. 3 yields an EOT of 12 Å. Arguably comparable films typically exhibit leakage current of 0.5 Å/cm. Since a thickness of 42 Å is approximated for films undergoing similar processing, a k of roughly 14 is estimated for the Y—O—Si film. The flatbed voltage ($V_{fb}$) is measured at −0.74 V which is shifted −0.68 V from the expected $V_{fb}$ for an ideal capacitor.

Example 4

Capacitance-Voltage (C-V) Curve for a Y—O—Si Film

The procedure according to Example 4 was carried out on a p-type Si substrate and the C-V curve is presented as set forth in FIG. 3. Analysis of the C-V curve for this film yields an EOT for 11 Å. The flatbed voltage ($V_{fb}$) is measured at −1.63 V which is shifted −0.84 V from the expected $V_{fb}$ for an ideal capacitor.

Example 5

Silicon Consumption During Oxidation

Figure 4A:
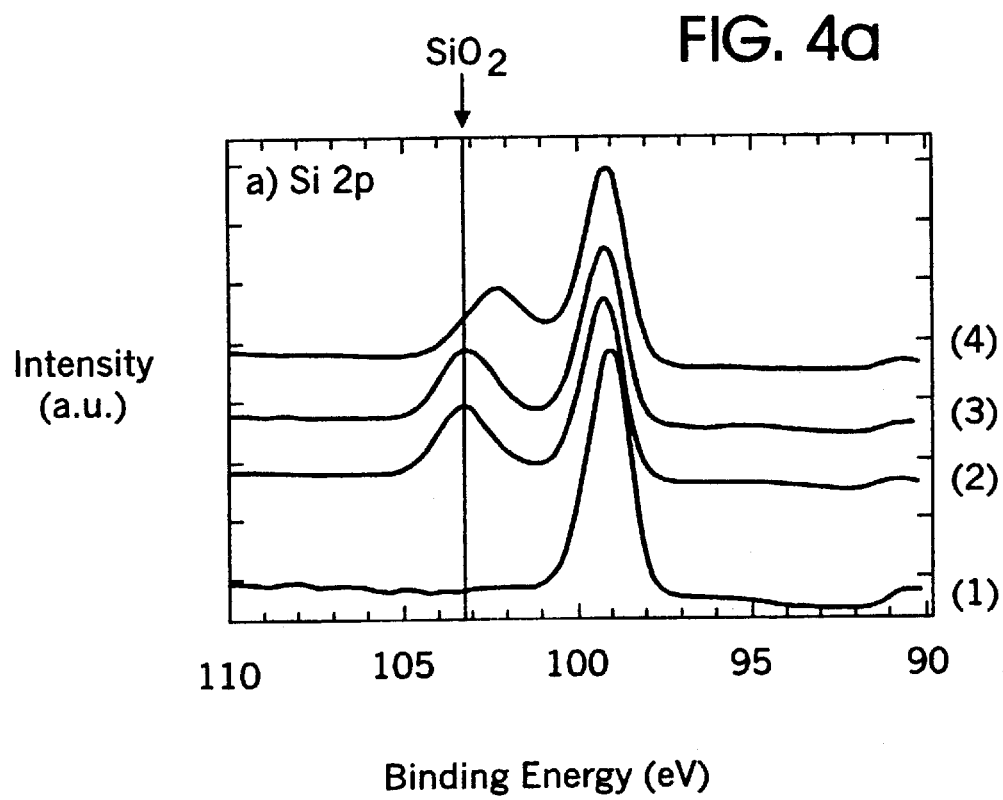
FIGS. 4a and 4b illustrate Si 2p and N 1s spectra for silicon surface pretreatments on substrates.
Figure 4B:
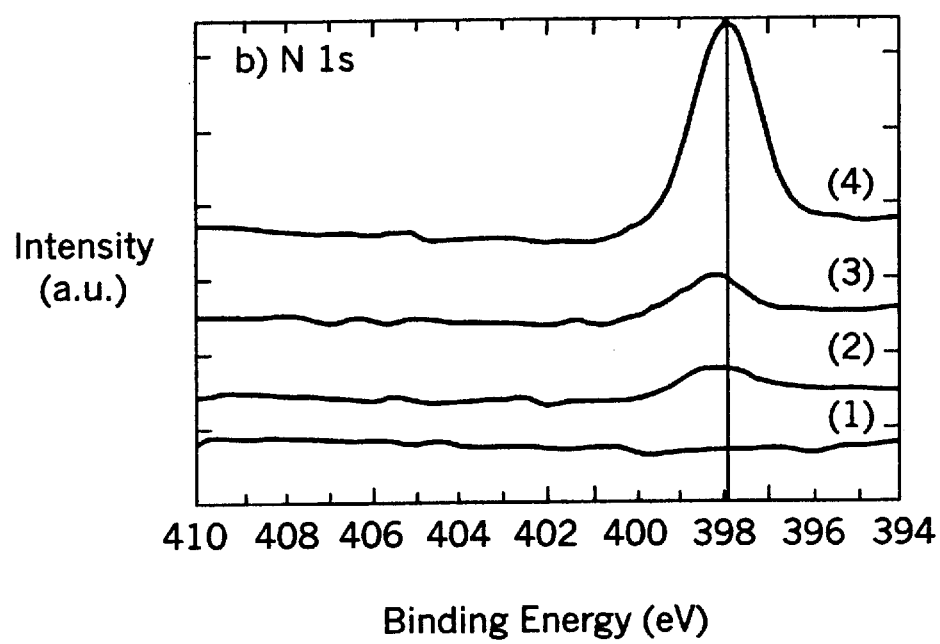

The consumption of silicon during oxidation of yttrium films is disclosed using the following pretreatments in the following embodiments labeled in FIGS. 4a and 4b as: (1) clean silicon, (2) oxidized silicon, (3) nitrided-oxidized silicon, and (4) nitrided silicon. The thickness of the plasma surface treatments is estimated using the attenuation of the silicon substrate peak as 5 Å to 10 Å. FIG. 4a illustrates the Si 2p spectra and FIG. 4b the N 1s spectra of the silicon surface pretreatments before yttrium deposition and oxidation. The silicon substrate peak (99.3 eV) in the Si 2p spectra (FIG. 6a) is clearly visible for each pretreatment. A high binding energy (102–103 eV) feature is believed to be observed in the Si 2p spectra for each of the plasma treated surfaces (FIG. 4a curves. (2)–(4)), but not for the clean silicon surface (FIG. 4a curve (1)). The feature at 103.3 eV for the plasma oxidized silicon (FIG. 4a curve (2)) and plasma oxidized silicon followed by nitridation (FIG. 4a curve (3)) is assigned to $SiO_2$. The feature at 102.4 eV on the plasma nitrided silicon (FIG. 4a curve (4)) surface is assigned to silicon bound to nitrogen. The thickness of the oxidized silicon and nitrided silicon layers was estimated from the attenuation of the $Si^o$ feature to range approximately from 5 Å to 10 Å. Little if any detectable nitrogen is observed on the surface of the cleaned silicon (FIG. 4b curve (1)). The N 1s spectra for the plasma oxidized silicon (FIG. 4b curve (2)), plasma oxidized silicon followed by nitridation (FIG. 4b curve (3)) and the plasma nitrided silicon (FIG. 4b curve (4)) all display a nitrogen feature near 398 eV. The plasma nitrided silicon is believed to contain the most nitrogen, but the N 1s feature of the plasma nitrided-oxidized silicon pretreatment is larger (approximately 70 percent) in area than the N 1s of the plasma oxidized silicon.

Example 6

Elemental Spectra of Deposited Film

Figure 5A:
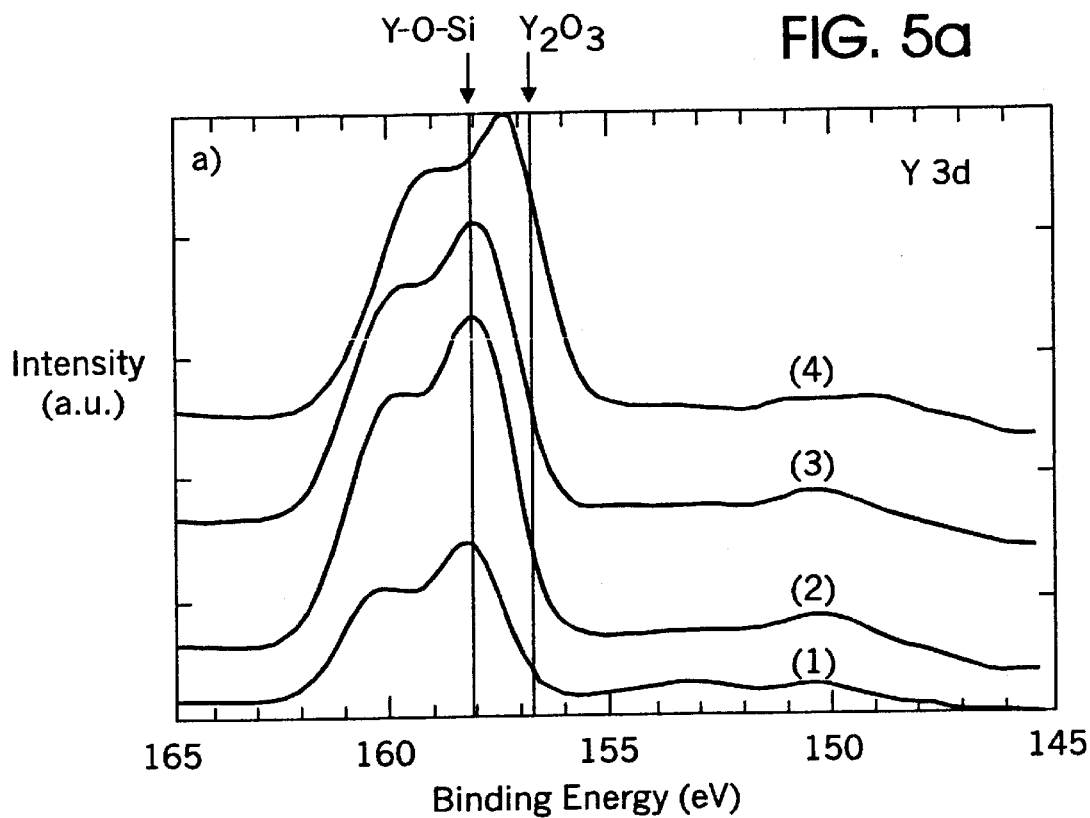
FIGS. 5a through 5c illustrate Y 3d, Si 2p, and O 1s regions of the XP spectra for yttrium silicate films formed on various substrates.
Figure 5B:
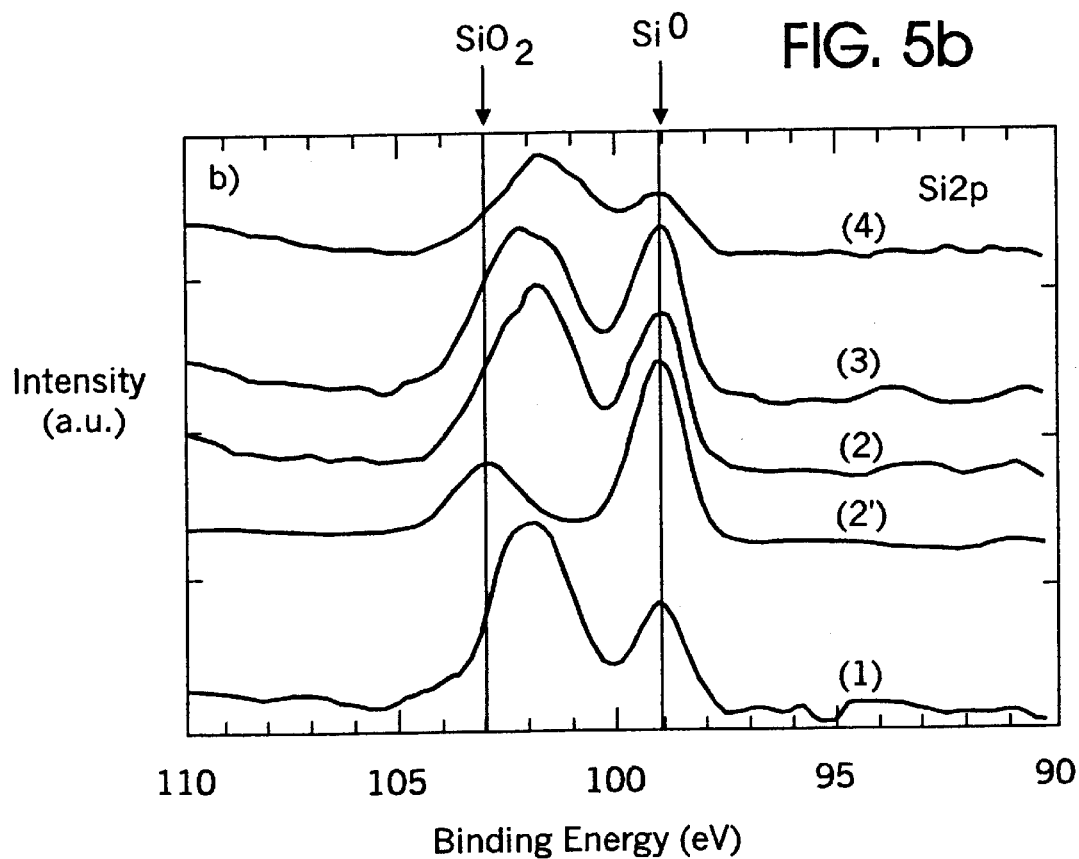
Figure 5C:
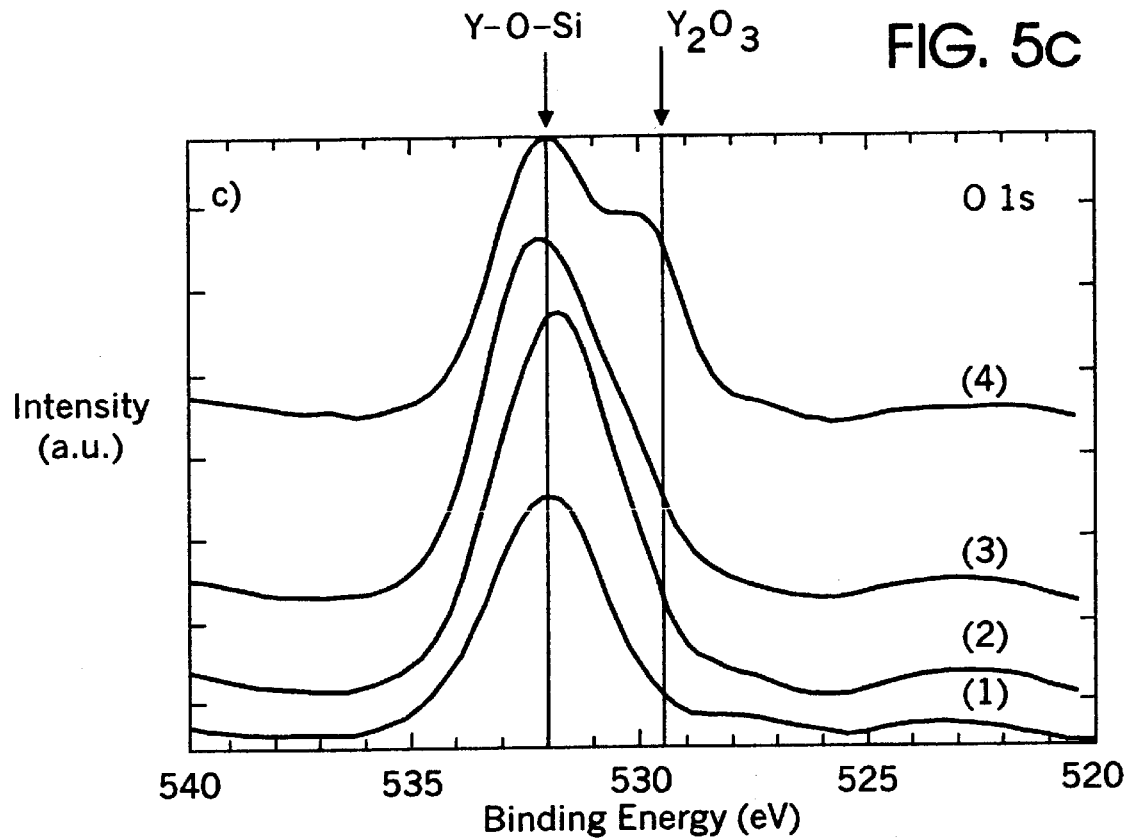

FIGS. 5a through 5c illustrate the Y 3d (FIG. 5a), Si 2p (FIG. 5b) and the O 1s (FIG. 5c) spectra after yttrium deposition and oxidation for embodiments represented by curves (1)–(4) set forth in Example 5. For oxidation of yttrium deposited onto clean silicon (FIG. 5a curve (1)), the Y $3d_{5/2}$ peak is measured at 158.3 eV consistent with a Y—O—Si film. The Y $3d_{5/2}$ peak positions for the films formed on oxidized silicon (FIG. 5a curve (2)) and oxidized silicon with nitridation (FIG. 5a curve (3)) are measured near 158.3 eV, with perhaps slight shifting to lower binding energy for the film formed on the nitrided-oxide. However, when yttrium is deposited on nitrided silicon and oxidized (FIG. 5a curve (4)), the Y $3d_{5/2}$ peak is observed to shift 0.8 eV to lower binding energy compared to the Y 3d position of the Y—O—Si film formed on clean silicon. As the Y 3d peak shifts to lower binding energy, it is believed to moves toward the expected peak position for $Y_2O_3$ (156.8 eV) which suggests an increase Y—O—Y bonding. A silicon substrate feature at 99.3 eV and a feature at approximately 102 eV are observed in the Si 2p spectra (FIG. 5b curves (1–4)) for the films formed on each silicon surface pretreatment. The Si 2p spectrum for the film formed on clean silicon (FIG. 5b curve (1)) exhibits a peak at 102.2 eV consistent with a Y—O—Si film. The Si 2p spectra for the films formed on oxidized silicon (FIG. 5b curve (2)) and nitrided-oxidized silicon (FIG. 5b curve (3)) exhibits similar features at approximately 102 eV. The spectrum for the plasma-oxidized silicon from FIG. 5a curve (2) is reproduced in FIG. 5b curve (2') for reference. The feature at 102.0 eV for the film formed on nitrided silicon (FIG. 5b curve (4)) is shifted 0.2 eV toward lower binding energy and is approximately 50 percent of the area of the film formed on clean silicon. The O 1s peak at 532.0 eV measured for the Y—O—Si film formed on clean silicon (FIG. 5c curve (1)) is observed in this instance to be a broad peak which is believed to result from the combined effects of oxygen bound to yttrium and oxygen bound to silicon. Slight shifting of the O 1s peak maximum is observed when comparing the spectra for the films formed on oxidized silicon (FIG. 5c curve (2)), nitrided-oxidized silicon (FIG. 5c curve (3)) and nitrided silicon (FIG. 5c curve (4)) to the spectrum for the film formed on clean silicon (FIG. 5c curve (1)). However, the most pronounced difference between these spectra are observed to be the shoulders at approximately 530.0 eV observed in the O 1s spectrum of the films formed on nitrided-oxidized silicon and nitrided silicon. The shoulders at approximately 530.0 eV are near the expected binding energy for O 1s in $Y_2O_3$ (529.5 eV) and indicate an increase in the O—Y—O bonding in the films.

Example 7

Elemental Spectra of Deposited Film

Figure 6A:
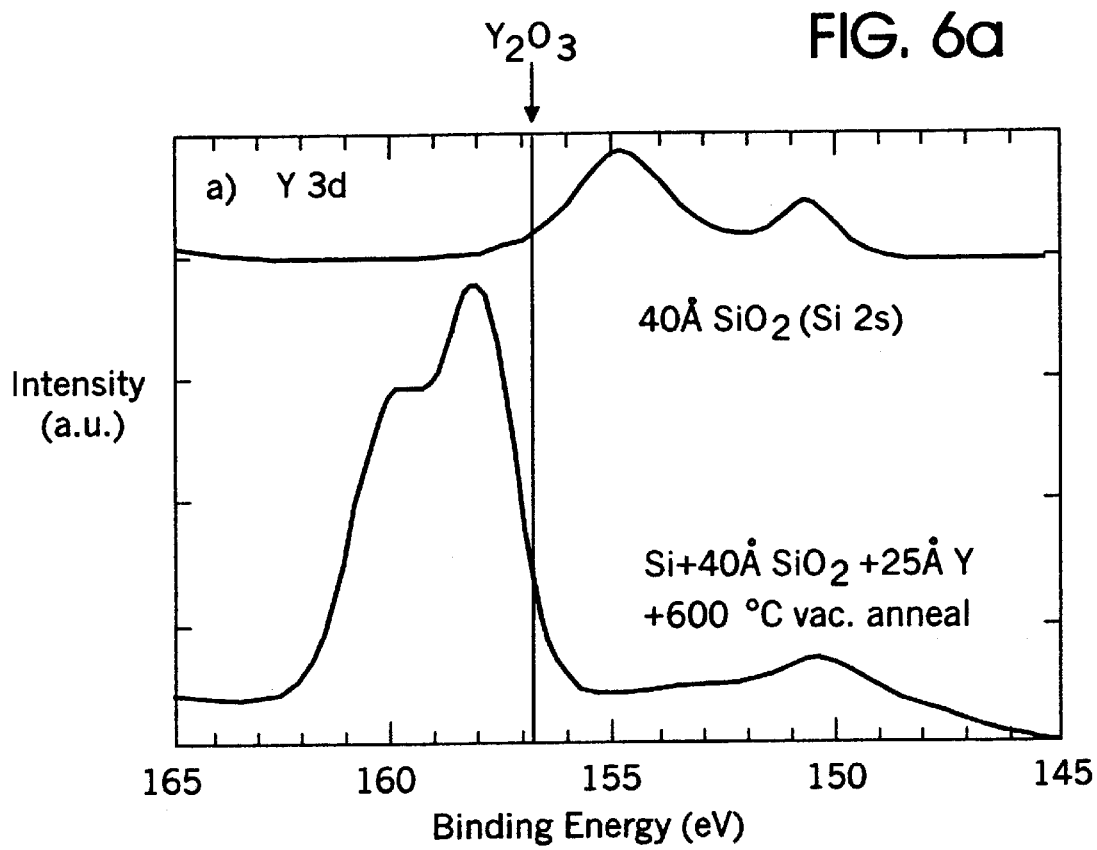
FIGS. 6a through 6c illustrate Y 3d, Si 2p, and O 1s spectra for various films.
Figure 6B:
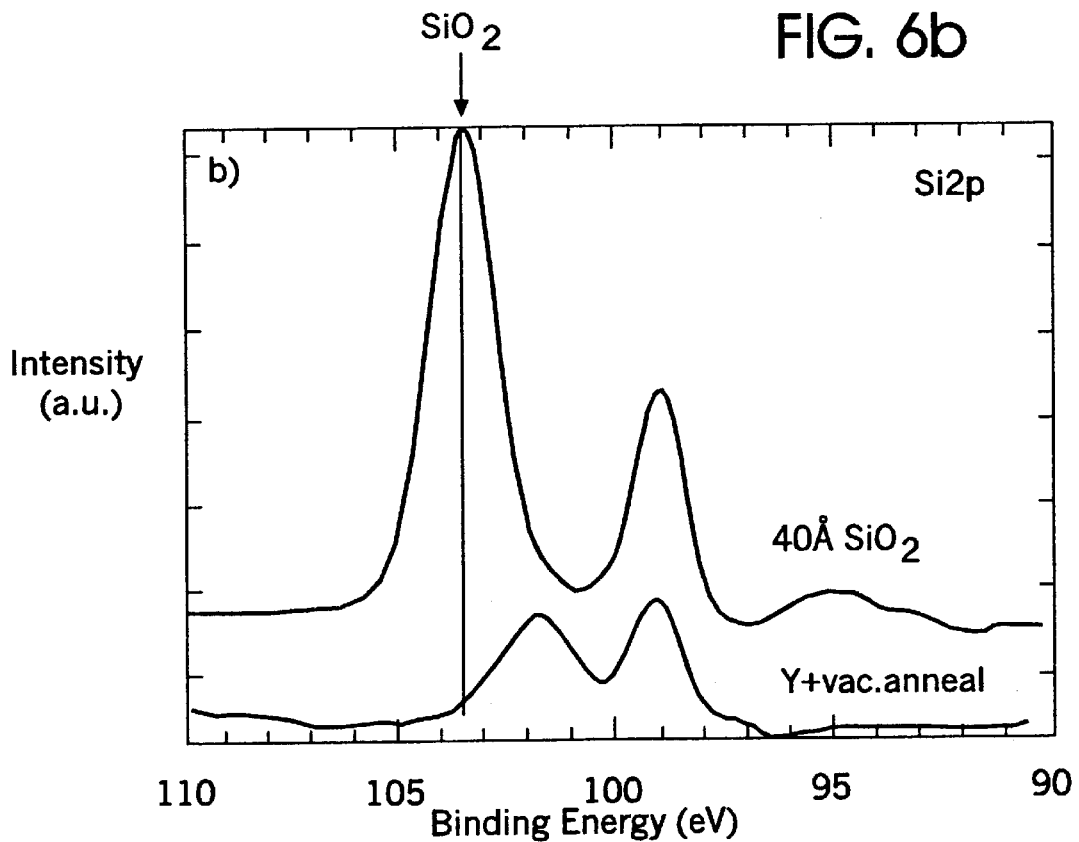
Figure 6C:
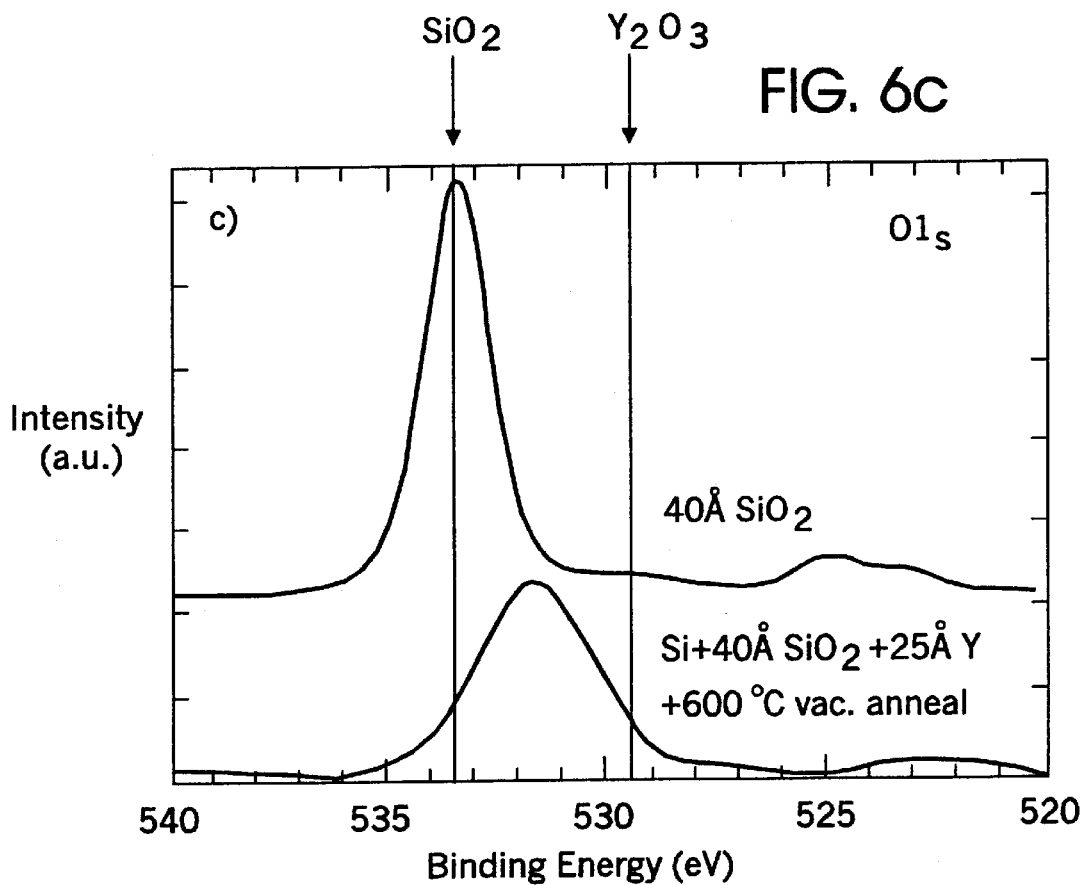

Y 3d, Si 2p, and O 1s spectra are illustrated in FIGS. 6a through 6c, respectively. These spectra are measured for a 40 Å thick $SiO_2$ and a yttrium film having an approximate thickness of 25 Å on 40 Å $SiO_2$ annealed in vacuum at 600° C. for 2 minutes.

In general, these figures illustrate the XPS results for yttrium on $SiO_2$ annealed at 600° C. in vacuum for 2 minutes. The spectrum for the 40 Å $SiO_2$ is presented as a comparison. The Y $3d_{5/2}$ (FIG. 6a), Si—O Si 2p (FIG. 6b) and O 1s (FIG. 6c) peaks for yttrium on $SiO_2$ annealed in vacuum are measured at 158.2, 102.0 and 531.7 eV, similar to the peaks for the yttrium film on $SiO_2$ oxidized at 600° C. and 900° C. The Si—O feature (FWHM=2.3 eV) for the yttrium on silicon annealed in vacuum exhibits little if any presence of $SiO_2$. The O 1s peak is a broad peak (FWHM= 3.1 eV) resulting from oxygen bound to yttrium and silicon.

The spectra as presented in these figures are believed to suggest the conversion of $SiO_2$ to Y—O—Si when yttrium on silicon is exposed to oxidizing or vacuum annealing conditions.

The invention will now be described in reference to the claims, the scope of which are not limited by the embodiments referred to hereinabove.

That which is claimed:

1. A method of forming an insulation layer on a semiconductor substrate, said method comprising:
    oxidizing a surface of the semiconductor substrate to form a silicon dioxide layer thereon;
    after said oxidizing step, depositing at least one metal or metal-containing compound on the surface of the silicon dioxide layer; and
    annealing the semiconductor substrate to modify the surface of the semiconductor substrate to form a non-crystalline insulation layer on the surface of the semiconductor substrate, wherein the insulation layer comprises the metal or metal-containing compound, oxygen, and silicon such that the dielectric constant of the insulation layer is greater relative to an insulation layer formed of silicon dioxide, and wherein the insulation layer comprises metal-oxygen-silicon bonds.

2. The method according to claim 1, wherein the semiconductor substrate comprises at least one material selected from the group consisting of silicon, silicon carbide, gallium arsenide, gallium nitride, and combinations thereof.

3. The method according to claim 1, wherein the metal is selected from the group consisting of yttrium, lanthanum, scandium, zirconium, halfnium, cesium, aluminum, and combinations thereof.

4. The method according to claim 1, wherein the metal-containing compound is an alloy which is an aluminate.

5. The method according to claim 1, wherein the metal-containing compound is an alloy comprising at least one metal selected from the group consisting of yttrium, lanthanum, scandium, zirconium, halfnium, cesium, aluminum, and combinations thereof.

6. The method according to claim 1, wherein the metal-containing material is a metal oxide.

7. The method according to claim 1, wherein the insulation layer has a defect density no greater than $10^{12}$ atoms/$cm^2$.

8. The method according to claim 1, wherein the insulation layer comprises of from about 2 to about 40 atomic percent of the metal, from about 40 to about 66 atomic percent of oxygen, and about or above 0 to about 33 atomic percent of silicon.

9. The method according to claim 1, wherein the insulation layer has a dielectric constant which is at least a factor of 3 greater relative to an insulation layer that does not include the metal or metal-containing compound.

10. The method according to claim 1, wherein the insulation layer has a thickness ranging from about 5 Å to about 100 Å.

11. The method according to claim 1, wherein said modifying step comprises forming the insulating layer on the semiconductor substrate; and subjecting the semiconductor substrate and the insulating layer to conditions sufficient such that the metal or metal-containing compound react with the insulating layer to modify the insulating layer to increase the dielectric constant.

12. The method according to claim 11, wherein said step of subjecting the semiconductor substrate to conditions sufficient such that the metal or metal-containing compound forms the insulation layer comprises subjecting the semiconductor substrate to a process selected from the group consisting of an annealing in a vacuum, annealing in an oxidizing ambient, and annealing in a combined vacuum/oxidation ambient such that the insulation layer is formed.

13. The method according to claim 1, wherein said modifying step comprises subjecting the semiconductor substrate to an annealing/oxidation ambient to form the insulation layer.

14. The method according to claim 1, wherein said modifying step comprises depositing the at least one metal or metal-containing compound by chemical vapor deposition or reactive atomic layer chemical vapor deposition.

15. The method according to claim 1, wherein said step of oxidizing the semiconductor substrate to form a silicon dioxide layer thereon is a plasma oxidation.

16. The method according to claim 1, wherein the at least one metal or metal-containing compound is a metal oxide and wherein said step of depositing the at least one metal or metal-containing compound on the surface of the semiconductor substrate comprises employing a Chemical Vapor Deposition process or a plasma Chemical Vapor Deposition process.

17. The method according to claim 1, wherein said step of annealing the semiconductor substrate comprises exposing the semiconductor substrate to a nitrogen-containing atmosphere.

18. The method according to claim 1, wherein said modifying step comprises:
- exposing the semiconductor substrate to nitrogen-containing atmosphere to form a nitrogen-containing film thereon;
- depositing at least one metal oxide compound on the surface of the nitrogen-containing film; and
- annealing the semiconductor substrate to modify the surface of the semiconductor substrate.

19. A surface-modified semiconductor substrate comprising:
- a semiconductor substrate comprising silicon; and
- a noncrystalline insulation layer formed on an oxidized surface of the semiconductor substrate, said insulation layer comprises a metal or metal-containing compound, oxygen, and silicon such that the dielectric constant of the insulation layer is greater relative to an insulation layer formed of silicon dioxide, and wherein the insulation layer comprises metal-oxygen-silicon bonds.

20. The substrate according to claim 19, wherein the semiconductor substrate comprises at least one material selected from the group consisting of silicon, silicon carbide, gallium arsenide, gallium nitride, and combinations thereof.

21. The substrate according to claim 19, wherein the metal is selected from the group consisting of yttrium, lanthanum, scandium, zirconium, halfnium, cesium, aluminum, and combinations thereof.

22. The substrate according to claim 19, wherein the metal-containing compound is an alloy which is an aluminate.

23. The substrate according to claim 19, wherein the metal-containing compound is an alloy comprising at least one metal selected from the group consisting of yttrium, lanthanum, scandium, zirconium, halfnium, cesium, aluminum, and combinations thereof.

24. The substrate according to claim 19, wherein the metal-containing material is a metal oxide.

25. The substrate according to claim 19, wherein the insulation layer has a defect density no greater than $10^{12}$ atoms/cm$^2$.

26. The substrate according to claim 19, wherein the insulation layer comprises of from about 2 to about 40 atomic percent of the metal, from about 40 to about 66 atomic percent of oxygen, and about or above about 0 to about 33 percent of silicon.

27. The substrate according to claim 19, wherein the insulation layer has a dielectric constant which is at least a factor of 3 greater relative to an insulation layer that does not include the metal or metal-containing compound.

28. The substrate according to claim 19, wherein the insulation layer has a thickness ranging from about 5 Å to about 100 Å.

29. A microelectronic device comprising the surface-modified semiconductor substrate as recited by claim 19.

30. The microelectronic device according to claim 29, wherein the microelectronic device is selected from the group consisting of a thin film transistor, a CMOS gate dielectric device, a memory device, a molecular electronic device, and an organic electronic device.

31. The microelectronic device according to claim 29, wherein the microelectronic device comprises elements electronically or physically coupled with semiconducting substrates.

32. The microelectronic device according to claim 29, wherein the semiconductor substrate comprises at least one material selected from the group consisting of silicon carbide, gallium arsenide, gallium nitride, and combinations thereof.

33. The microelectronic device according to claim 29, wherein the metal is selected from the group consisting of yttrium, lanthanum, scandium, zirconium, halfnium, cesium, aluminum, and combinations thereof.

34. The microelectronic device according to claim 29, wherein the metal-containing compound is an alloy which is an aluminate.

35. The substrate according to claim 29, wherein the metal-containing compound is an alloy comprising at least one metal selected from the group consisting of yttrium, lanthanum, scandium, zirconium, halfnium, cesium, aluminum, and combinations thereof.

36. The microelectronic device according to claim 29, wherein the metal-containing material is a metal oxide.

37. The microelectronic device according to claim 29, wherein the insulation layer has a defect density no greater than $10^{12}$ atoms/cm$^2$.

38. The microelectronic device according to claim 29, wherein the insulation layer comprises of from about 2 to about 40 atomic percent of the metal, from about 40 to about 66 atomic percent of oxygen, and about or above about 0 to about 33 percent of silicon.

39. The microelectronic device according to claim 29, wherein the insulation layer has a dielectric constant which is at least a factor of 3 greater relative to an insulation layer that does not include the metal or metal-containing compound.

40. The microelectronic device according to claim 29, wherein the insulation layer has a thickness ranging from about 5 Å to about 100 Å.

* * * * *